(12) United States Patent
Blonigan et al.

(10) Patent No.: US 7,083,702 B2
(45) Date of Patent: Aug. 1, 2006

(54) RF CURRENT RETURN PATH FOR A LARGE AREA SUBSTRATE PLASMA REACTOR

(75) Inventors: Wendell Blonigan, Union City, CA (US); Ernst Keller, Sunnyvale, CA (US); Carl Sorensen, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 302 days.

(21) Appl. No.: 10/460,916

(22) Filed: Jun. 12, 2003

(65) Prior Publication Data

US 2004/0250955 A1    Dec. 16, 2004

(51) Int. Cl.
*H01L 21/00*    (2006.01)

(52) U.S. Cl. .............................. 156/345.47

(58) Field of Classification Search ............ 118/723 E, 118/723 R, 719, 718, 729, 728, 715, 724, 118/725; 204/298.01, 298.02, 298.11; 156/345.51, 156/345.43, 345.44, 345.45, 345.46, 345.47; 315/111.21

See application file for complete search history.

(56) References Cited

U.S. PATENT DOCUMENTS

| | | | |
|---|---|---|---|
| 5,423,936 A * | 6/1995 | Tomita et al. ......... | 156/345.34 |
| 5,558,717 A * | 9/1996 | Zhao et al. ................ | 118/715 |
| 5,900,062 A | 5/1999 | Loewenhardt et al. .. | 118/723 R |
| 5,900,064 A | 5/1999 | Kholodenko ............ | 118/723 R |
| 6,012,600 A * | 1/2000 | Pham et al. ............. | 220/203.1 |
| 6,024,044 A | 2/2000 | Law et al. | |
| 6,057,235 A * | 5/2000 | Leiphart et al. ............ | 438/680 |
| 6,129,808 A * | 10/2000 | Wicker et al. ............ | 156/345.1 |
| 6,221,221 B1 | 4/2001 | Al-Shaikh et al. | |
| 6,254,746 B1 * | 7/2001 | Subramani et al. ..... | 204/298.11 |
| 6,277,237 B1 | 8/2001 | Schoepp et al. | |
| 6,345,589 B1 | 2/2002 | Ramiah et al. .......... | 118/723 E |
| 6,349,670 B1 * | 2/2002 | Nakano et al. .......... | 118/723 E |
| 6,364,958 B1 | 4/2002 | Lai et al. | |
| 6,511,577 B1 | 1/2003 | Johnson .................. | 156/345.48 |
| 6,531,030 B1 | 3/2003 | Nakajima ............... | 156/345.48 |
| 6,652,713 B1 * | 11/2003 | Brown et al. ........... | 156/345.51 |
| 6,726,805 B1 * | 4/2004 | Sherstinsky et al. ..... | 156/345.5 |
| 6,779,481 B1 * | 8/2004 | Kent et al. .............. | 118/723 R |
| 6,857,387 B1 * | 2/2005 | Sun et al. ................ | 118/723 E |

(Continued)

FOREIGN PATENT DOCUMENTS

EP    1 030 345    8/2000

(Continued)

OTHER PUBLICATIONS

Merriam-Webster's Collegiate Dictionary, 1998, Meriam-Webster, Incorporated, Tenth Edition, p. 585.*

(Continued)

*Primary Examiner*—Parviz Hassanzadeh
*Assistant Examiner*—Michelle Crowell
(74) *Attorney, Agent, or Firm*—Patterson & Sheridan LLP

(57) ABSTRACT

An apparatus for providing a return current path for RF current between a chamber wall and a substrate support is provided comprising a low impedance flexible curtain having a first end and a second end, the first end adapted to be electrically connected to the chamber wall and the second end adapted to be connected to the substrate support, wherein the curtain further comprises at least one fold in the curtain material, located an axial distance between the first end and the second end, and at least one perforation cut into the curtain proximate the second end.

40 Claims, 9 Drawing Sheets

U.S. PATENT DOCUMENTS

| | | |
|---|---|---|
| 2003/0029564 A1 | 2/2003 | Brown et al. |
| 2003/0029568 A1 | 2/2003 | Brown et al. .......... 156/345.51 |
| 2003/0047281 A1 | 3/2003 | Hirose et al. |
| 2003/0079691 A1 | 5/2003 | Shang et al. |

FOREIGN PATENT DOCUMENTS

| | | |
|---|---|---|
| EP | 1030345 | 8/2000 |

OTHER PUBLICATIONS

PCT Search Report for International Application No. PCT/US2004/017387 dated May 23, 2005.

PCT International Preliminary Report on Patentability, Written Opinion of the International Searching Authority, Mail Date Dec. 29, 2005 (PCT/US2004/017387).

* cited by examiner

RF CURRENT RETURN PATH FOR A LARGE AREA SUBSTRATE PLASMA REACTOR

FIELD OF THE INVENTION

The present invention generally relates to processing equipment used in the processing of large area substrates, and more particularly relates to an RF current return path for such equipment.

BACKGROUND OF THE INVENTION

Liquid crystal displays or flat panels are commonly used for active matrix displays such as computer and television monitors, personal digital assistants (PDAs), cell phones and the like. Generally, flat panels comprise two glass plates having a layer of liquid crystal material sandwiched therebetween. At least one of the glass plates includes at least one conductive film disposed thereon that is coupled to a power supply. Power supplied to the conductive material film from the power supply changes the orientation of the liquid crystal material, creating patterns such as text or graphics that may be seen on the display. One fabrication process frequently used to produce flat panels is plasma enhanced chemical vapor deposition (PECVD).

Plasma enhanced chemical vapor deposition is generally employed to deposit thin films on a glass substrate such as those utilized to fabricate flat panels. Plasma enhanced chemical vapor deposition is generally accomplished by introducing a precursor gas into a vacuum chamber that contains the substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of a substrate that is positioned on a temperature controlled substrate support. The substrate support is typically grounded to the chamber body. In applications where a layer of low temperature polysilicon is deposited onto the substrate, the substrate support may be heated in excess of 400 degrees Celsius. Volatile by-products produced during the reaction are pumped from the chamber through an exhaust system.

During this process, the substrate support is biased negatively with respect to the plasma to further enhance deposition. This is accomplished by providing a bias voltage to an electrode within the substrate support assembly. With a negative bias voltage applied to the substrate support, positively ionized material in the plasma is attracted to and deposits on the substrate in a highly perpendicular manner, improving the deposition characteristic known as "step coverage".

Ideally, the bias voltage on the substrate support remains stable as the ionized material is deposited onto the substrate. A stable bias voltage results in ionized deposition material being drawn and deposited uniformly across the width of the substrate. Voltage stability is realized when there is no appreciable voltage drop due to current flowing from the substrate support to ground. If the voltage drop is significant, the differential may induce plasma to strike between two points at substantially different voltages, such as the substrate support (at a high potential) and a nearby grounded feature (such as a chamber wall), thereby damaging the processing environment and possibly contaminating the substrate. Some systems employ a low impedance strap to couple the substrate support to the chamber body to facilitate grounding of the substrate support.

FIG. 10 is a simplified perspective, cutaway view of an exemplary conventional processing chamber 30 having a plurality of straps 20 for electrically coupling a substrate support 40 to a wall 32 or bottom 34 of the chamber 30. Four of eight straps 20 are shown in FIG. 10, two straps 20 coupled to each edge of the substrate support 40.

The substrate support 40 typically includes a plurality of lift pins 52, some of which are disposed along the edge of the substrate support 40 to lift the edges of the substrate during transfer. A lift plate 50 is disposed below the substrate support 40 and may be vertically actuated to extend the lift pins 52 through the substrate support 40 to space a substrate from the substrate support during substrate transfer.

Each of the straps 20 includes a first and second flexures 22, 24 separated by a bend 26. The straps 20 are generally aligned with the perimeter of the substrate support 40 and spaced to provide room for the lift pins 52 to extend below the substrate support 40. In order to provide clearance of a lift plate 50 positioned below the substrate support 40 that is utilized to vertically actuate the lift pins 52, the bend 22 of each strap 20 is oriented perpendicular to the proximate edge of the substrate support 40 (i.e., the edge of the support that the strap is coupled to) to keep the bend 26 of the strap 20 from being positioned further inward relative to the substrate support 40 than the flexures 22, 24. As the straps 20 cannot extend into the area occupied by the lift plate 50 and lift pins 52, the number and size of the straps 20 are limited to the number that may be linearly aligned and nested along the edge of the substrate support 40, while remaining clear of those lift pins 52 positioned along the edge of the substrate support 40.

While this configuration has proven to be effective and reliable for smaller scale applications, it is less effective for larger area glass substrate processing applications which necessitate higher current flow for adequate grounding. As the next generation of large area substrates utilized for flat panel fabrication approaches 1100 mm×1300 mm, with even larger sizes envisioned for the near future, the substrate supports utilized to process these large area substrates have increased in size as well and would benefit from increased grounding capacity not currently available from conventional designs. The conductive straps such as those described above cannot be coupled between the processing chamber and the substrate support with sufficient density to adequately limit the voltage drop between the processing chamber and substrate support in such large scale processing applications. Additionally, because the straps are spaced around the perimeter of the substrate support to leave gaps for the lift pins and if the gaps are sufficiently wide, those portions of the substrate support between the straps may be biased at a higher potential relative to those portions that are directly coupled to a strap, which may adversely effect deposition uniformity.

Therefore, there is a need for a reliable low-impedance RF current return path suitable for use in large area substrate processing applications.

SUMMARY OF THE INVENTION

Embodiments of the invention generally provide an RF current return path for large area substrate processing. In one embodiment, an apparatus for providing an RF current return path between a processing chamber and a substrate support includes a low impedance flexible curtain having a first end adapted to be electrically connected to the processing chamber and a second end adapted to be connected to the substrate support, wherein the curtain further comprises at least one fold in the curtain material, located between the first end and the second end, and at least one perforation formed through the curtain proximate the second end.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The invention generally provides an RF current return path for systems supporting large area substrates. The invention is illustratively described below in reference to a plasma enhanced chemical vapor deposition (PECVD) system, such as those commercially available from AKT, a division of Applied Materials, Inc. of Santa Clara, Calif. However, it should be understood that the invention has utility in other system configurations such as physical vapor deposition systems, etch systems and other processing systems in which providing a low-impedance RF current return path between a substrate support and a chamber housing the substrate support is desired.

Figure 1:
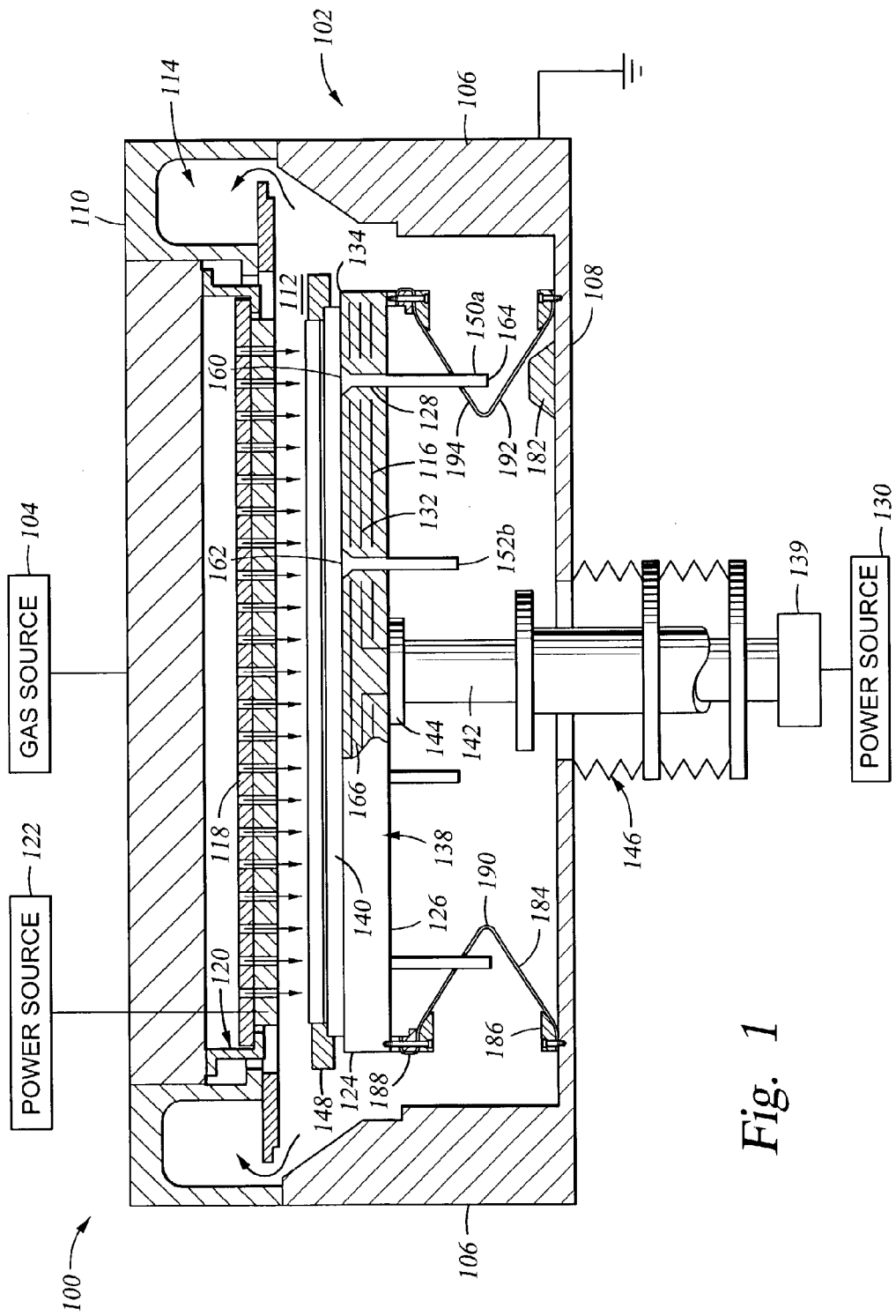
FIG. 1 is a cross sectional view of one embodiment of a processing system having a ground curtain of the present invention.

FIG. 1 is a cross sectional view of one embodiment of a plasma enhanced chemical vapor deposition system 100 having one embodiment of a ground curtain 184 that provides a low-impedance path between a substrate support assembly 138 and ground. The system 100 generally includes a grounded chamber 102 coupled to a gas source 104 and a power source 122. The chamber 102 has sidewalls 106, a bottom 108 and a lid assembly 110 that define a process volume 112. The process volume 112 is typically accessed through a port (not shown) in the sidewall 106 that facilitates movement of a large area glass substrate 140 (hereinafter referred to as "substrate 140") into and out of the chamber 102. The sidewalls 106 and bottom 108 are typically fabricated from a unitary block of aluminum or other material compatible with processing. The lid assembly 110 contains a pumping plenum 114 that couples the process volume 112 to an exhaust port that is coupled to various pumping component (not shown).

The lid assembly 110 is supported by the sidewalls 106 and can be removed to service the chamber 102. The lid assembly 110 is generally comprised of aluminum. A distribution plate 118 is coupled to an interior side 120 of the lid assembly 110. The distribution plate 118 is typically fabricated from aluminum. The center section of the distribution plate 118 includes a perforated area through which process and other gases supplied from the gas source 104 are delivered to the process volume 112. The perforated area of the distribution plate 118 is configured to provide a uniform distribution of gases passing through the distribution plate 118 into the chamber 102. The power source 122 is coupled to the distribution plate 118 to provide an electrical bias that energizes the process gas and sustains a plasma in the interior volume 112 below the gas distribution plate 118 during processing.

The heated substrate support assembly 138 is centrally disposed within the chamber 102. The support assembly 138 supports the substrate 140 during processing. The substrate support assembly 138 generally includes an electrically conductive body 124 that is generally polygonal in shape and covered with an electrically insulative coating (not shown) over at least the portion of the body 124 that supports the substrate 140. The coating may also cover other portions of the body 124.

The support body 124 may be fabricated from metals or other comparably electrically conductive materials. The insulative coating may be a dielectric material such as an oxide, silicon nitride, silicon dioxide, aluminum dioxide, tantalum pentoxide, silicon carbide or polyimide, among others, which may be applied by various deposition or coating processes, including, but not limited to, flame spraying, plasma spraying, high energy coating, chemical vapor deposition, spraying, adhesive film, sputtering and encapsulating.

In one embodiment, the substrate support assembly 138 includes an aluminum body 124 that encapsulates at least one embedded heating element 132 and a thermocouple (not shown). At least a first reinforcing member 116 may be embedded in the body 124 proximate the heating element 132. A second reinforcing member 166 may be disposed within the body 124 on the side of the heating element 132 opposite the first reinforcing member 116. The reinforcing members 116, 166 may be comprised of metal, ceramic or other stiffening materials.

The heating element 132, such as an electrode disposed in the support assembly 138, is coupled to a power source 130 and controllably heats the support assembly 138 and substrate 140 positioned thereon to a predetermined temperature. Typically, the heating element 132 maintains the substrate 140 at a uniform temperature of about 150 to at least about 460 degrees Celsius during processing.

Generally, the support assembly 138 has a lower side 126 and an upper side 134 that supports the substrate 140 thereon. The lower side 126 has a stem cover 144 coupled thereto. The stem cover 144 generally is an aluminum ring coupled to the support assembly 138 that provides a mounting surface for the attachment of a stem 142 thereto.

Generally, the stem 142 extends from the stem cover 144 and couples the support assembly 138 to a lift system 139 that moves the support assembly 138 between an elevated process position (as shown) and a lowered position that facilitates substrate transfer. A bellows 146 provides a vacuum seal between the chamber volume 112 and the atmosphere outside the chamber 102 while facilitating the vertical movement of the support assembly 138. The stem 142 additionally provides a conduit for electrical and thermocouple leads between the support assembly 138 and other components of the system 100.

The support assembly 138 additionally supports a circumscribing shadow frame 148. Generally, the shadow frame 148 prevents deposition at the edge of the substrate 140 and support assembly 138 so that the substrate 140 does not stick to the support assembly 138.

The support assembly 138 has a plurality of holes 128 disposed therethrough that accept a plurality of lift pins 150. The lift pins 150 are typically comprised of ceramic or anodized aluminum. Generally, the lift pins 150 have first ends 160 that are substantially flush with or slightly recessed from an upper side 134 of the support assembly 138 when the lift pins 150 are in a normal position (i.e., retracted relative to the support assembly 138). The first ends 160 are generally flared to prevent the lift pins 150 from falling through the holes 128. Additionally, the lift pins 150 have a second end 164 that extends beyond the lower side 126 of the support assembly 138. As the support assembly 138 is lowered to a transfer position, the lift pins 150 come in contact with the bottom 108 of the chamber 102 and are displaced through the support assembly 138 to project from the upper side 134 of the support assembly 138, thereby placing the substrate 140 in a spaced-apart relation to the support assembly 138.

In one embodiment, lift pins 150a, 150b of varying lengths are utilized so that they come into contact with the bottom 108 and are actuated at different times. For example, long lift pins 150a spaced around the outer edges of the substrate 140, combined with relatively shorter lift pins 150b spaced inwardly from the outer edges toward the center of the substrate 140, allow the substrate 140 to be gradually lifted from its outer edges to its center. In another embodiment, lift pins 150a, 150b of a uniform length are utilized, but the bottom 108 of the chamber 102 comprises bumps or plateaus 182 positioned beneath the outer lift pins 150a, so that the outer lift pins 150a are actuated before the inner lift pins 150b. Alternatively, the chamber bottom 108 may comprise grooves or trenches positioned beneath the inner lift pins 150b, so that the inner lift pins 150b are actuated after the outer lift pins 150a.

The support assembly 138 is generally grounded such that an RF power supplied by the power source 122 to the distribution plate 118 (or other electrode positioned within or near the lid assembly 110 of the chamber 102) may excite the gases disposed within the process volume 112 between the support assembly 138 and the distribution plate 118. The RF power from the power source 122 is generally selected commensurate with the size of the substrate 140 to drive the chemical vapor deposition process.

The curtain 184 provides an RF current return path between the support assembly 138 and chamber 102. The curtain 184 generally comprises a first end 186, a second end 188, and at least one bend 190. The first end 186 is electrically connected to one of the chamber walls 106, 108, while the second end 188 is electrically connected to the support assembly 138, typically to the lower side 126 of the conductive body 124.

A first flexure 192 extends from the bend 190 toward the first end 186, and a second flexure 194 extends from the bend 190 toward the second end 188. The flexures 192, 194 are substantially quadrilateral in shape and allow for vertical movement of the support assembly 138 relative to the chamber bottom 108.

The curtain 184 may extend continuously around the entire support assembly 132 or a portion of the perimeter of the body 124. In one embodiment, a single curtain 184 extends continuously around substantially the full perimeter of the body 124 (e.g., so that the curtain 184 contacts each edge of the polygonal body 124). Alternatively, a plurality of curtains 184 may be positioned adjacent to one another to extend around substantially the full perimeter of the body 124, wherein at least one curtain is coupled to each edge of the polygonal support assembly 132. In a further embodiment, several curtains 184, each having a width of at least twelve inches, are positioned one on each edge of a polygonal body 124.

The curtain 184 is comprised of a flexible, low impedance conductive metal that is resistant to processing and cleaning chemistries. In one embodiment, the curtain 184 is comprised of aluminum and is approximately 0.008 to 0.016 inch thick. Alternatively, the curtain 184 may comprise titanium, stainless steel, or a flexible material that is coated with a conductive metallic coating.

The curtain 184 significantly shortens the return path for RF current to ground as compared to conventional grounding techniques. Current passes from the plasma to the substrate 140, which is in electrical contact with the conductive body 124 of the support assembly 138. The lower side 126 of the body 124 is in electrical contact with the curtain 184, so that the current passes from the body 124 through the curtain 184 and to the chamber wall 106, 108, which is connected to ground. Furthermore, the curtain 184 provides a larger current carrying area than existing conductive strap designs, making them ideally suitable for use in large area processing applications. The shorter distance and larger current carrying capacity of the curtain 184 results in a much lower voltage differential between the surface of the support assembly 138 and the grounded chamber 102, thereby substantially reducing the likelihood of plasma ignition below the substrate support assembly 138 that may sputter unwanted contaminants in the chamber 102.

Figure 2:
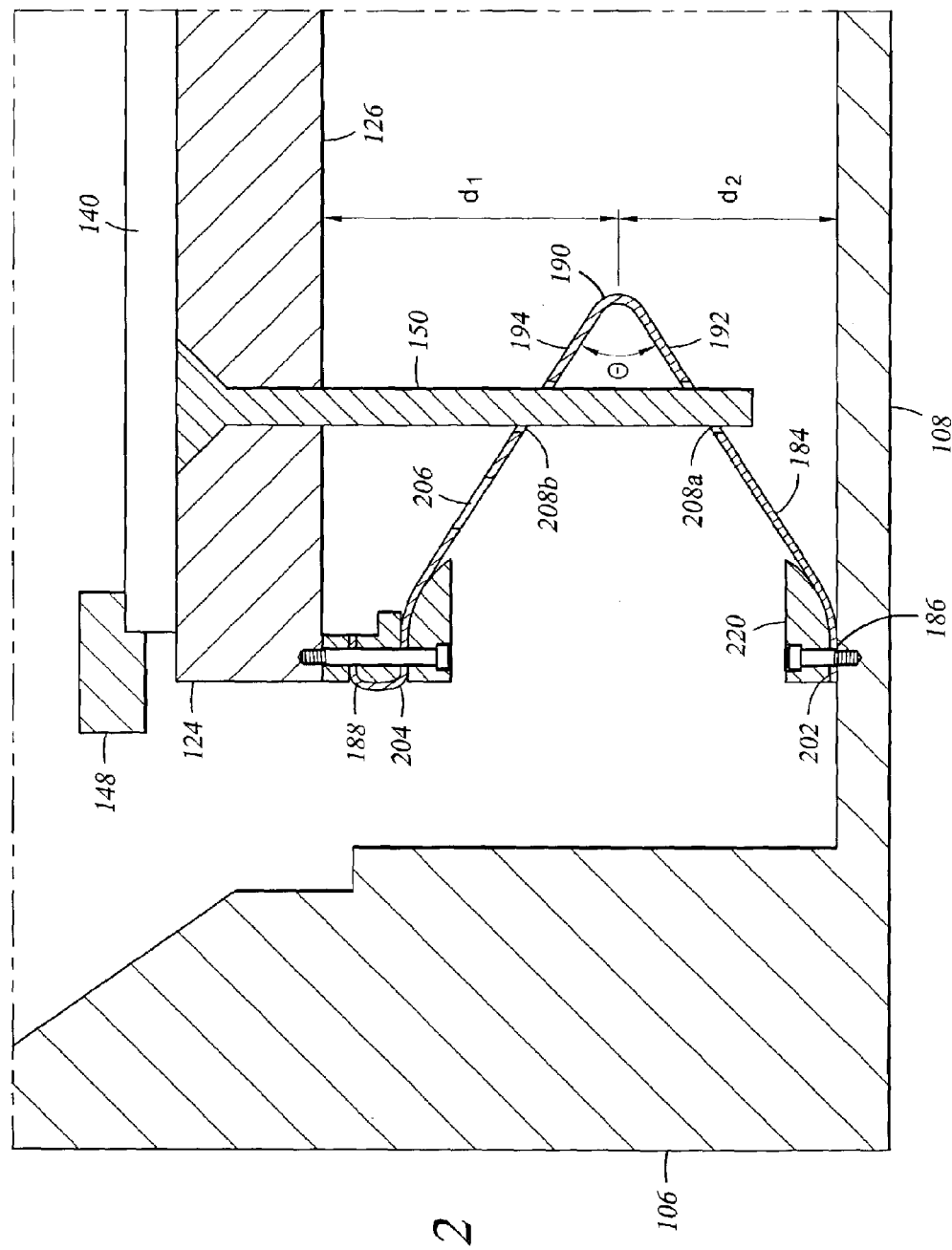
FIG. 2 is a side cross sectional view of one embodiment of an RF ground curtain according to the present invention.
Figure 7:
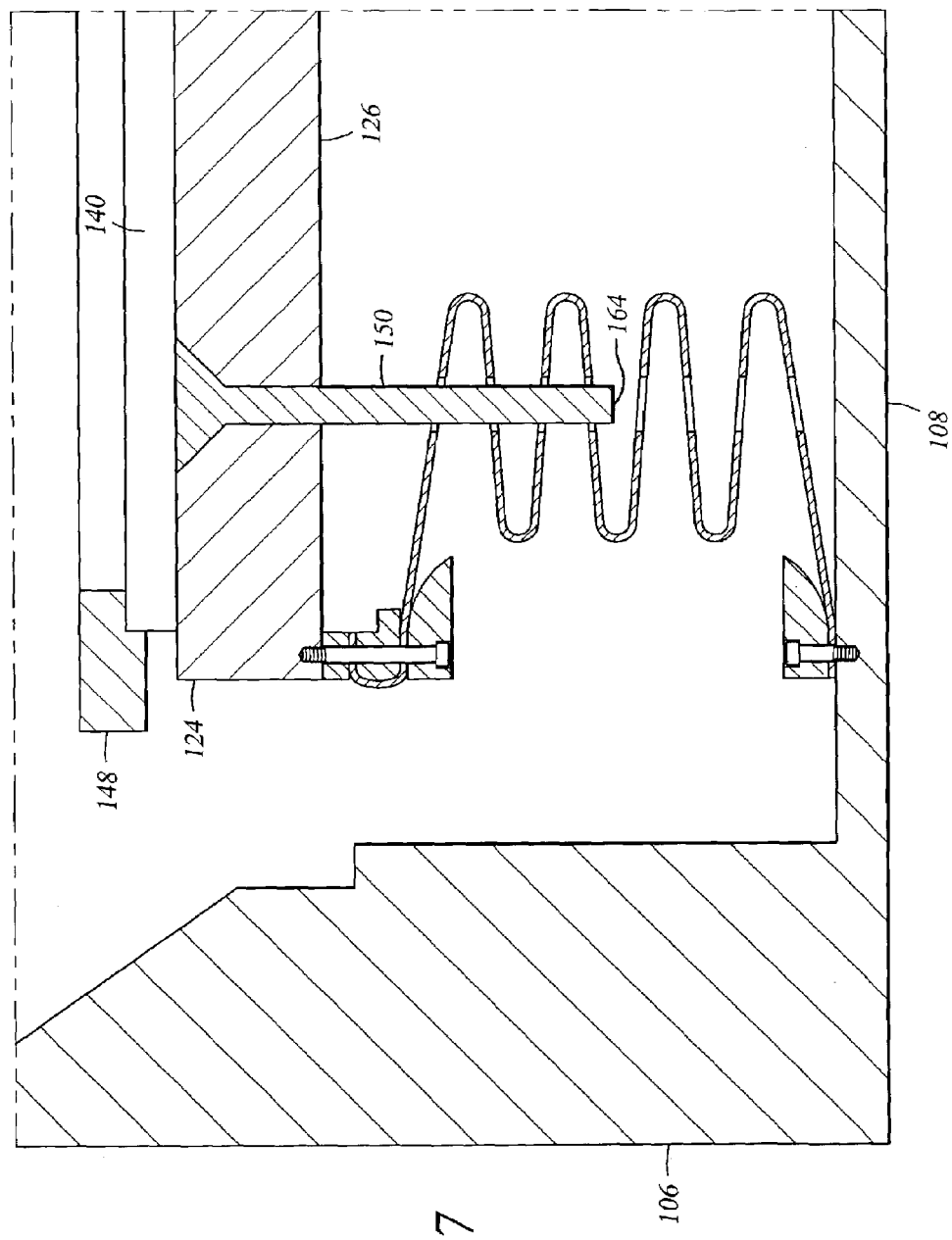
FIG. 7 is a cross sectional view of a second embodiment of an RF ground curtain according to the present invention.

FIG. 2 is a cross sectional view of the curtain 184. In one embodiment, the curtain 184 comprises at least one bend 190, positioned between the first end 186 and the second end 188 to define first and second flexures 192, 194 that allow vertical movement of the support assembly 138. Although the curtain 184 in FIG. 2 comprises only one bend 190, multiple bends 190 may be formed in the curtain 184 to form an accordion-like structure as shown in FIG. 7. The bends 190 are positioned below the polygonal substrate support assembly 138 and are oriented substantially parallel to the edge of the support assembly 138 to which the second end 188 of the curtain 184 is attached. The bends 190 are pre-formed in the curtain 184 to increase the useful life of the curtain 184; repeated stress transmitted into the curtain 184 by vertical movement of the support assembly 138 might otherwise cause the bends 190 to crack, necessitating replacement of the curtain 184.

The curtain 184 further comprises at least one lift pin aperture 208a formed in the first flexure 192 and at least one lift pin aperture 208b formed in the second flexure 194. The apertures 208a, 208b may be slots or other shaped openings. Typically, apertures 208a, 208b are positioned equidistant from the bend 190 so that the apertures 208a, 208b are aligned to allow the lower end 164 of a lift pin 150 to pass therethrough. The apertures 208a, 208b are therefore larger in diameter than the lift pins 150. As the substrate support assembly 138 is lowered vertically, the bottom ends 164 of the lift pins 150 come into contact with the bottom 108 of the chamber 102, which urges the pins 150 through the apertures 208a, 208b in the curtains 184 and the holes 128 in the body 124. Furthermore, actuation of the lift pins 150 by the bottom 108 of the chamber 102, instead of by a lift plate as used in conventional systems, allows the bends 190 of the curtain 184 to project inwardly from the perimeter of the substrate support assembly 138, into the space beneath the support assembly 138 (i.e., because there is no lift plate beneath the support assembly 138). Therefore, substantially the entire curtain 184 may be positioned beneath the support assembly 138, while still maintaining electrical contact with substantially the entire perimeter of the support assembly 138. In this way, the overall system may be manufactured more compactly and with fewer total components.

During processing, temperatures in the chamber 102 can range from 100 to 130 degrees Celsius near the chamber bottom 108, to upwards of 350 degrees Celsius on the surface of the support assembly 138 that is in contact with the substrate 140 during processing. Therefore, the second end 188 of the curtain 184, which is coupled to the support assembly 138, would normally be subject to a much greater degree of thermal expansion than the first end 186 of the curtain 184. Such variations in expansion could cause the curtain 184 to deform, impacting the functionality and the useful life of the curtain 184 in an undesirable way. To counteract the thermal differentials, at least one perforation 206 is formed in the curtain 184 proximate the second end 188 to allow for thermal expansion of the curtain 184. In one embodiment, a plurality of perforations 206, each having a width of approximately 0.8 inch, are spaced approximately every two inches along the second end 188 of the curtain 184.

Figure 5:
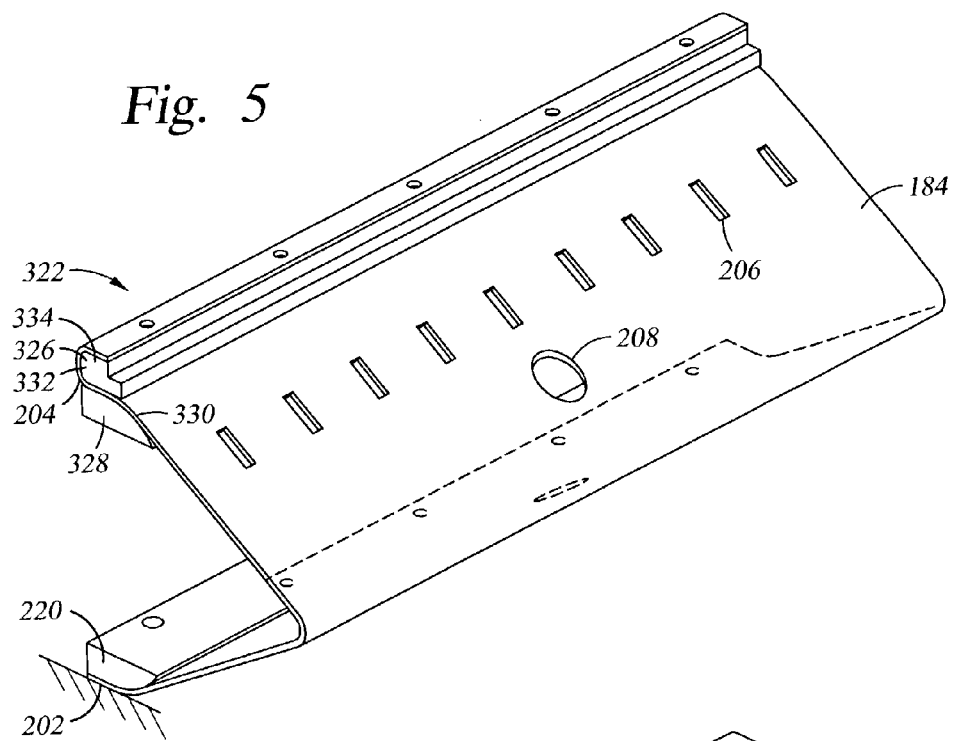
FIG. 5 is an isometric view of one embodiment of an RF ground curtain and connection assemblies according to the present invention.
Figure 6:
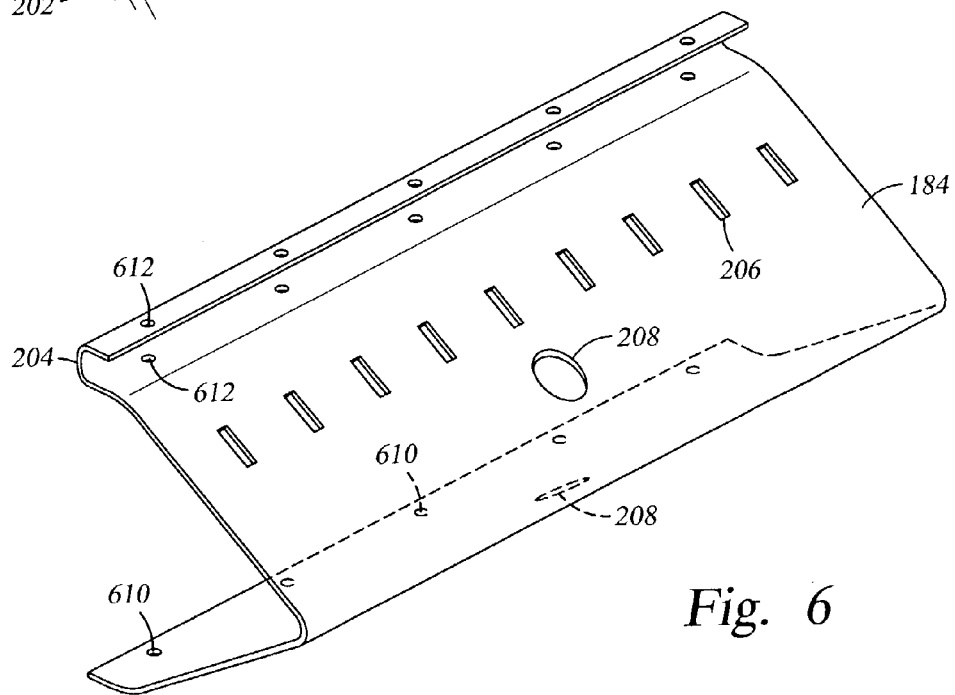
FIG. 6 is an isometric view of one embodiment of an RF ground curtain.

FIGS. 5 and 6 illustrate the features of the curtain 184 and a connection assembly 322 in greater detail. The curtain 184 further comprises a first mounting flange 202, formed at the first end 186 of the curtain 184, and a second mounting flange 204, formed at the second end 188 of the curtain 184. As with the bends 190, the mounting flanges 202, 204 are optionally pre-formed into the curtain 184 and are oriented substantially parallel to the edges of the polygonal substrate support assembly 138 to which the mounting flange 204 is attached. In one embodiment, the first mounting flange 202 is secured between the bottom 108 and a clamp bar 220. The clamp bar 220 and mounting flange 202 extend in a direction that is substantially parallel to the edge of the substrate support assembly 138 beneath which the clamp bar 220 and mounting flange 202 are positioned. The first mounting flange 202 further comprises at least one fastener hole (610 in FIG. 6) that is adapted to receive at least one fastener (not shown) disposed through the clamp bar 220, curtain 184 and chamber wall 108 to secure the curtain 184 in place.

Figure 3:
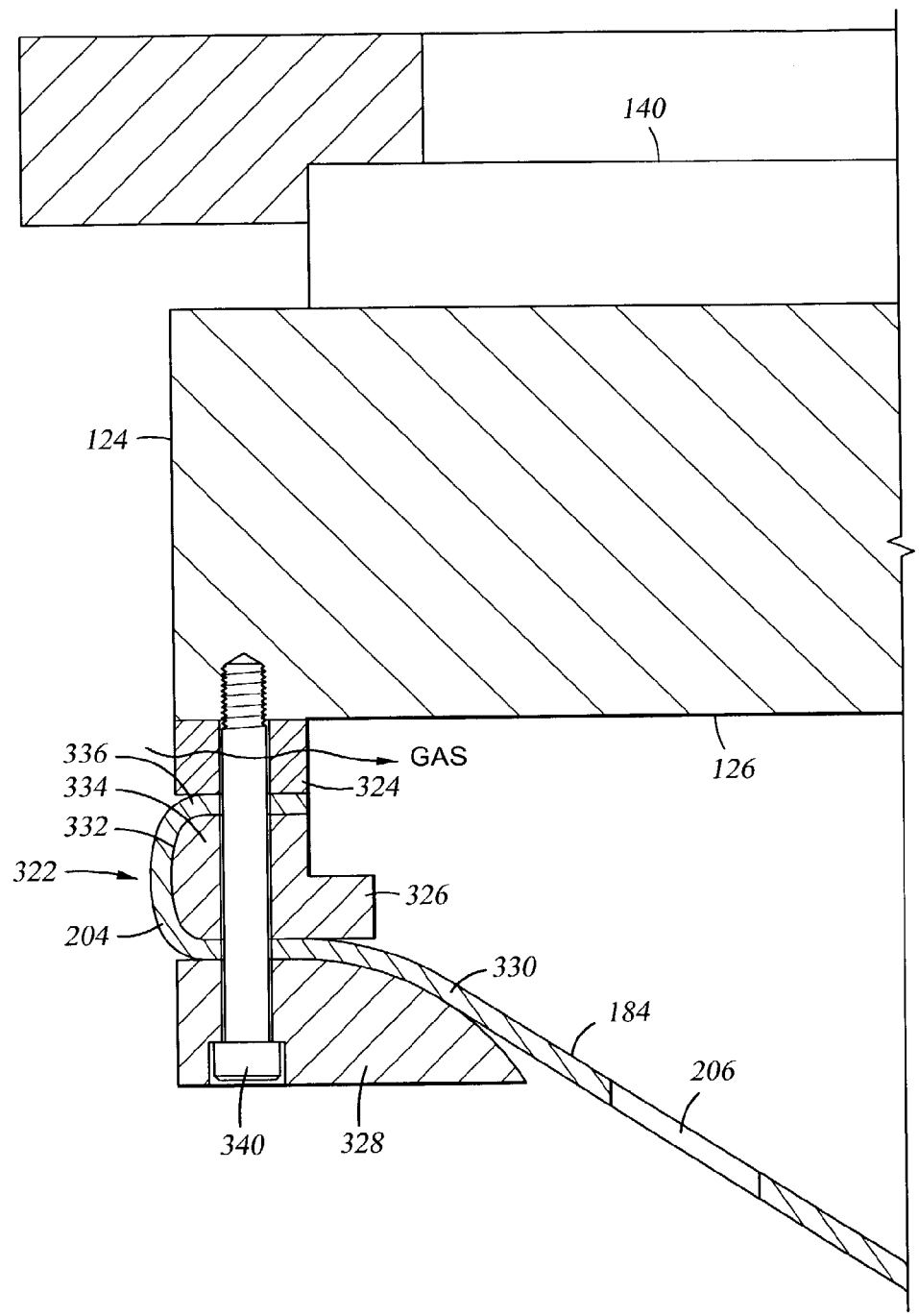
FIG. 3 is an enlarged partial side cross sectional view of an upper end of the ground curtain of FIG. 2.

FIG. 3 depicts the second mounting flange 204 in greater detail. In one embodiment, the second mounting flange 204 is secured to the support assembly 138 by a connection assembly 322. The connection assembly extends substantially parallel to an edge of the support assembly 138 to which the connection assembly 322 is coupled. The connection assembly 322 comprises a vent ring 324 that is coupled to the lower side 126 of the body 124 and an extension block 326 that is coupled between the clamp ring 324 and a contour block 328. The second mounting flange 204 is substantially U-shaped to pass over a curved surface 330 of the contour block 328, around a curved outer surface 332 of the extension block 326, and between substantially flat surfaces 334, 336 of the extension block 326 and the vent ring 324. The "U" portion of the second mounting flange 204 is substantially parallel to the edge of the support assembly 138 to which the mounting flange 204 is coupled. The vent ring 324, the extension block 326 and the contour block 328 each further comprises at least one fastener hole (not shown), and the second mounting flange 204 comprises at least one set of fastener holes (612 in FIG. 6) aligned and adapted to receive at least one fastener 340, such as a mounting screw, disposed through the second mounting flange 204 and the connection assembly 322.

Figure 4:
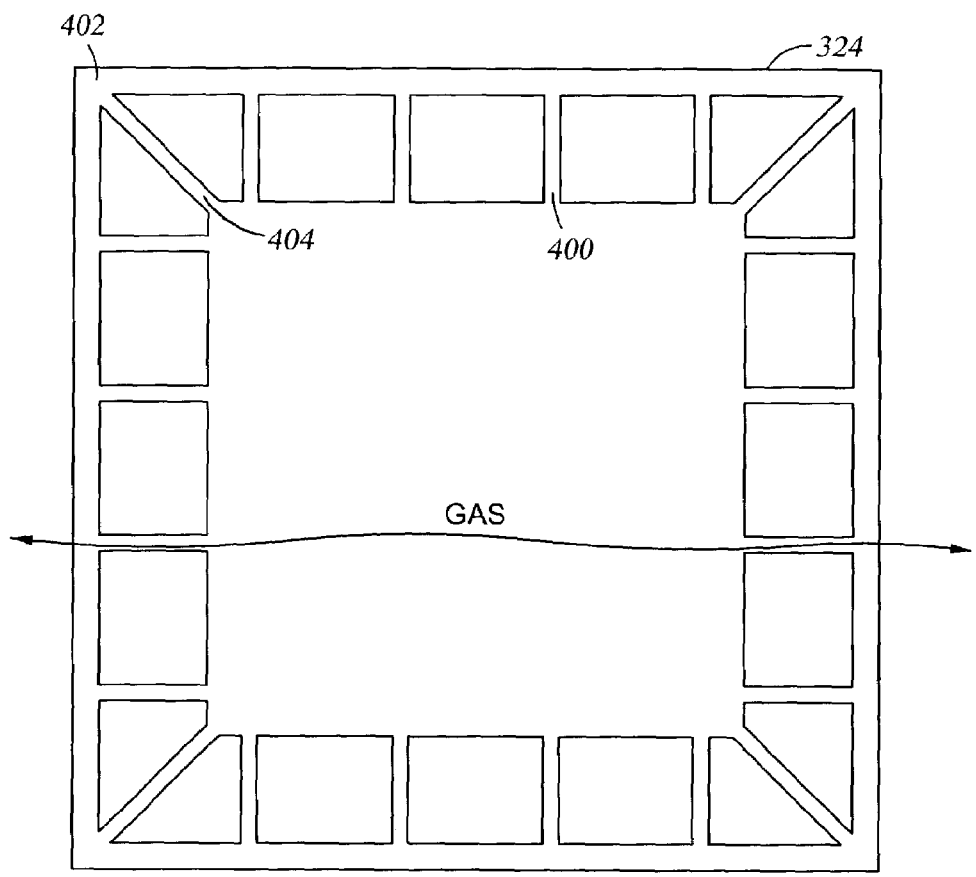
FIG. 4 is a top cross sectional view of one embodiment of a clamp ring for use in the connection assembly of FIG. 3.

FIG. 4 depicts one embodiment of the vent ring 324. The vent ring 324 comprises a plurality of vent paths 400 formed in the vent ring 324 and adapted to allow gas to flow therethrough. The vent paths 400 in the vent ring 324 allow the gases to pass through the connection assembly 322 to the area below the substrate support assembly 138. The corner sections 402 of the vent ring 324 optionally include bevel passages 404, i.e., passages cut at an angle relative to the sides of the support body 124 to enhance uniform gas passage through the vent ring 324.

Figure 8:
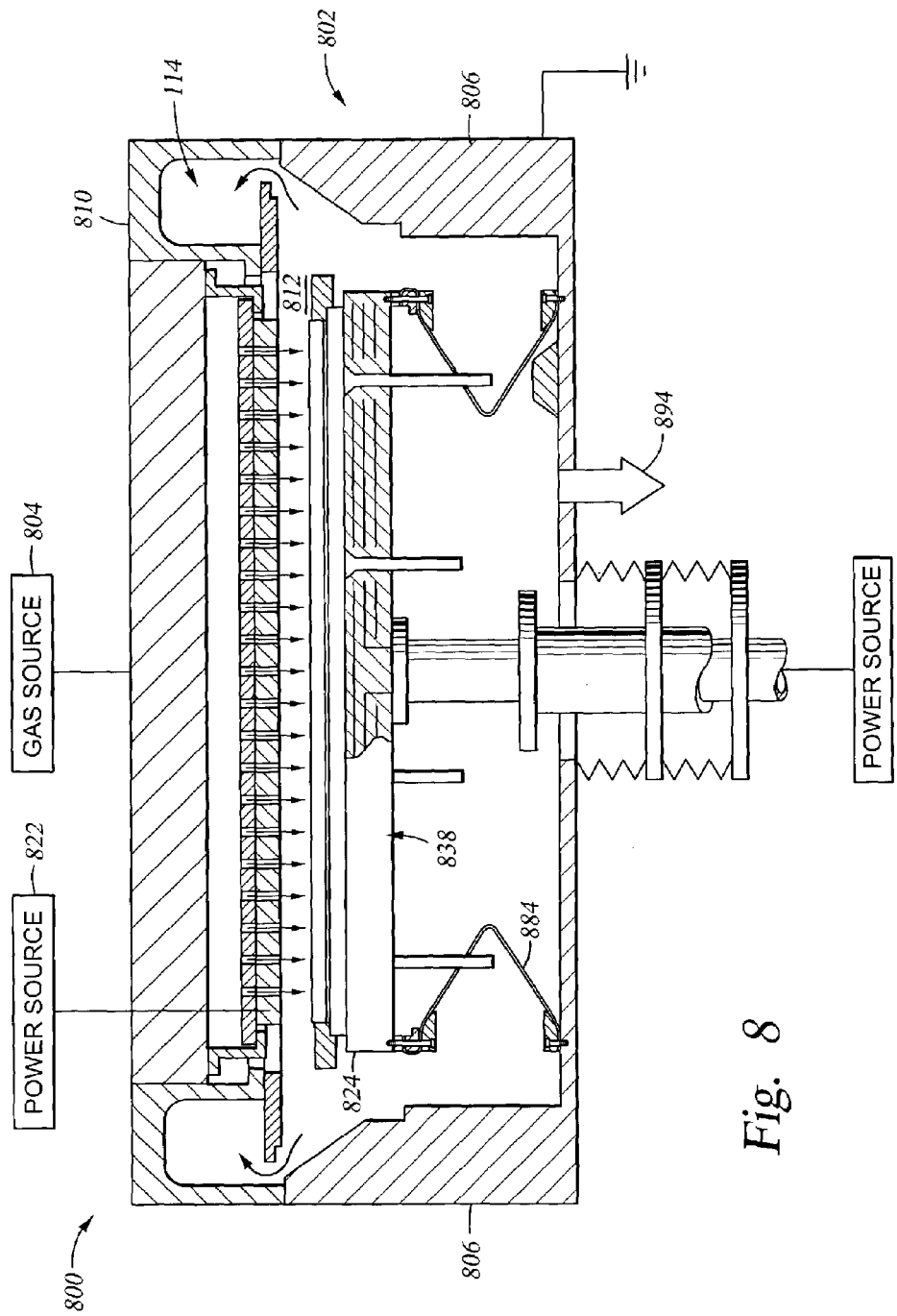
FIG. 8 is a cross sectional view of a second embodiment of a processing system that may be advantageously adapted to benefit from the present invention.

FIG. 8 is a cross sectional view of another embodiment of a processing system 800 in which a gas exhaust port 894 is disposed in the bottom 808 of the chamber 802, rather than proximate the lid 810. The system 800 is otherwise similar to the system 100 illustrated in FIG. 1 and generally includes a gas source 804 and power source 822 coupled to the chamber 802. The chamber 802 has sidewalls 806, a bottom 808 and a lid assembly 810 that define a process volume 812. The system 800 has a ground curtain 884, configured as described herein and disposed between a substrate support assembly 838 and a grounded chamber 802.

A vent ring 324 such as that illustrated in FIG. 4 is particularly ideally suited for use in the system 800. Vent paths 400 in the vent ring 324 would allow gases to pass from the region above the substrate support assembly 838 to the exhaust port 894, despite the presence of the curtain 884 that extends around substantially the full perimeter of the support assembly 838.

Figure 9:
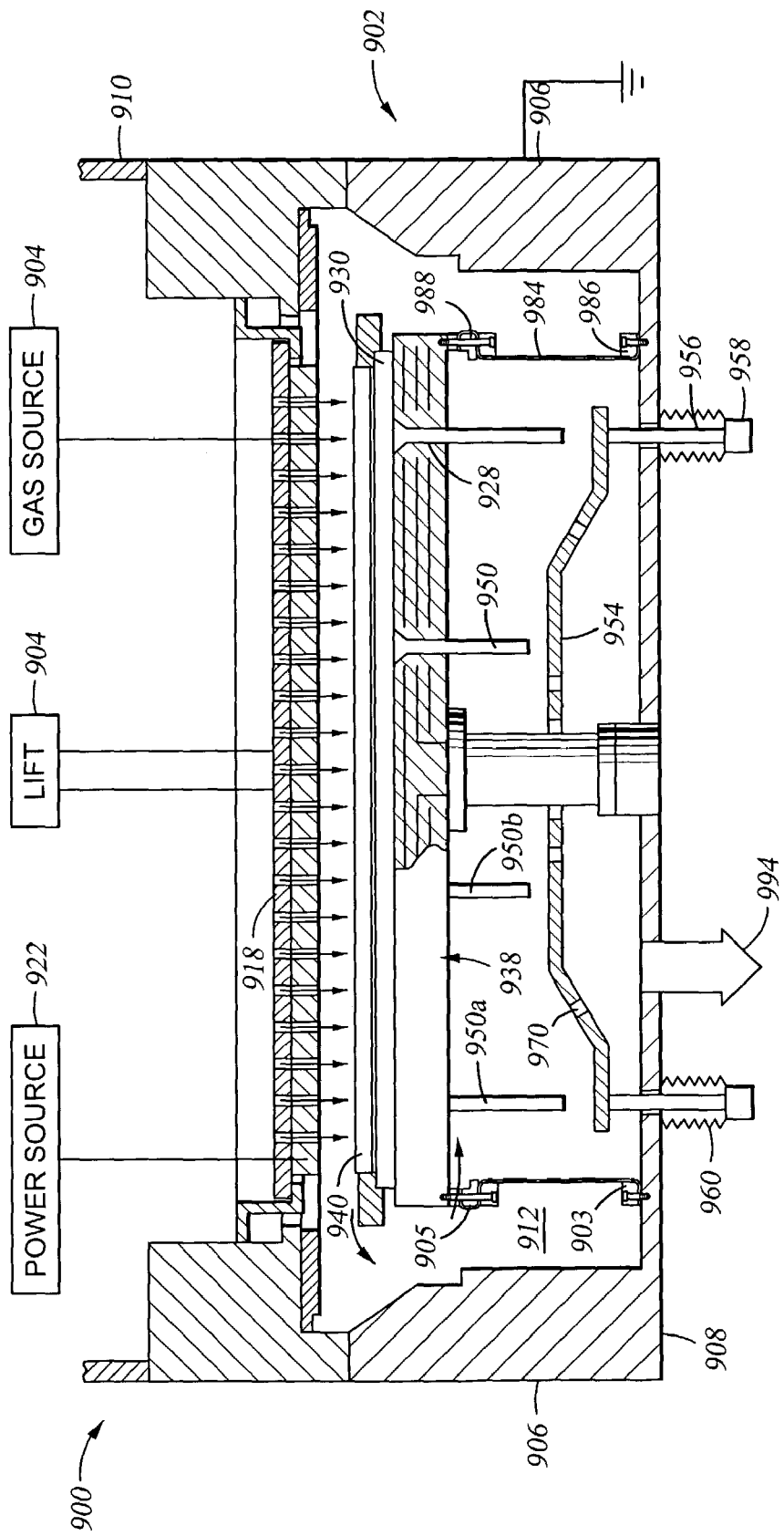
FIG. 9 is a cross sectional view of a third embodiment of a processing system that may be advantageously adapted to benefit from the present invention.
Figure 10:
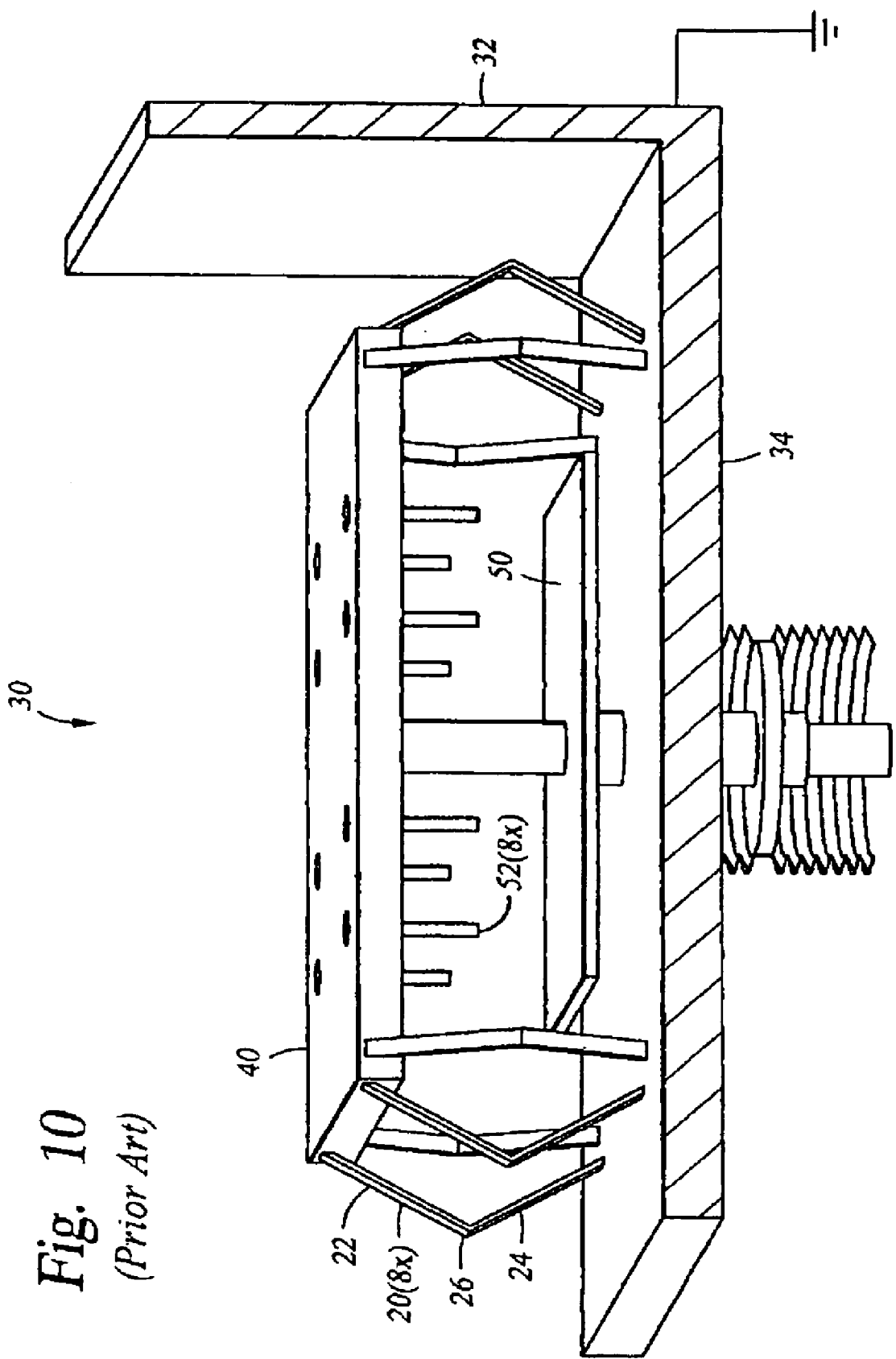
FIG. 10 is a partial cross sectional view of a prior art processing system having an RF current return path.

FIG. 9 is a cross sectional view of another embodiment of a processing system 900 having a ground curtain 984 disposed between a substrate support assembly 938 and a grounded chamber 902. The system 900 is similar to the system 100 illustrated in FIG. 1 and generally includes a gas source 904 and power source 922 coupled to the chamber 902. The chamber 902 has sidewalls 906, a bottom 908 and a lid assembly 910 that define a process volume 912.

A heated substrate support assembly 938 is centrally disposed within the chamber 902. The substrate support assembly 938 may be disposed at a fixed elevation relative to the chamber bottom 908. The support assembly 938 supports the large area glass substrate 940 during processing. The substrate support assembly 938 generally is similar to the support assembly 138 illustrated in FIG. 1; however, in the embodiment illustrated in FIG. 9, the support assembly 938 is fixed relative to at least one of the bottom 908 or the sidewalls 906 of the chamber 902.

A distribution plate 918 is disposed above the substrate support assembly 938 and is coupled to a lift 990 that moves the distribution plate 918 vertically relative to the support assembly 938 to control the spacing between the substrate support assembly 938 and the distribution plate 918 during processing. The distribution plate 918 is coupled to the power source 982 that energizes the distribution plate 918 with RF power during processing.

The support assembly 938 has a plurality of apertures 928 disposed therethrough that accept a plurality of lift pins 950. The lift pins 950 may be actuated relative to the support assembly 938 by a lift plate 954 to project from the support surface 930, thereby placing the substrate 940 in a spaced-apart relation to the support assembly 938. The lift plate 954 is coupled to an actuator 958 by a rod 956 that extends through the bottom 908 of the chamber 902. The actuator 958 enables the lift plate 954 to be moved vertically relative to the support assembly 938, thereby engaging the lift pins 950 and urging the lift pins 950 through the apertures 928. The lift plate 954 may be shaped to engage lift pins 950a, 950b of varying lengths simultaneously, or may be flat to engage the lift pins 950a, 950b in several stages. A bellows 960 surrounds the rod 956 to prevent leakage into chamber 902 under vacuum conditions. The lift plate 954 further comprises a plurality of vent holes 970 to allow gases to pass therethrough.

Because the support assembly 938 is fixed, the RF ground curtain 984 is not required to flex or accommodate motion, as is the ground curtain 184 illustrated in the previous Figures. Therefore, a curtain 984 may be advantageously adapted to extend continuously around the full perimeter of the stationary support assembly 938 wherein the curtain 984 is not required to flex to accommodate substrate support movement. The curtain 984 may be cylindrical or linear in form and is not required to have a bend or bends. The curtain 984 is otherwise substantially similar to the curtain 184, having a first end 986 electrically connected to the chamber bottom 908 and a second end 988 that is connected to the support assembly 938. The curtain 984 comprises first and second mounting flanges 903, 905, configured as described herein, and secured to the wall 908 and support assembly 938 by a clamp bar and connection assembly such as those previously illustrated. Perforations for thermal expansion are cut into the second end 988 of the curtain 984.

Thus, the present invention represents a significant advancement in the field of large area substrate processing. An apparatus is provided that significantly limits voltage drops in an RF current return path and is suitable for use in large scale processing systems such as those used to fabricate flat panel and liquid crystal displays. Furthermore, the apparatus is manufactured for improved functionality and durability, incorporating integral features that limit cracking and deformations caused by repeated stress and exposure to heat.

While the foregoing is directed to embodiments of the invention, other and further embodiments of the invention may be devised without departing from the basic scope thereof, and the scope thereof is determined by the claims that follow.

What is claimed is:

1. An apparatus for providing an RF current return path between a chamber body and a substrate support, comprising:
    a low impedance flexible curtain having a first end and a second end, the first end adapted to be electrically connected to the chamber body and the second end adapted to be electrically connected to the substrate support, wherein the curtain further comprises:
    at least one bend located between the first end and the second end;
    a first flexure extending from the at least one bend toward the first end;
    a second flexure extending from the at least one bend toward the second end;
    a first lift pin hole formed in the first flexure; and
    a second lift pin hole formed in the second flexure, wherein the holes in the first and second flexures are aligned equidistantly from the at least one bend.

2. The apparatus of claim 1, wherein the flexures are substantially quadrilateral in shape.

3. The apparatus of claim 1, wherein the first end of the curtain is at least twelve inches wide.

4. The apparatus of claim 1, wherein the curtain comprises at least one of aluminum or an aluminum coating.

5. The apparatus of claim 1, wherein the first end of the curtain comprises a first mounting flange that extends substantially parallel to the at least one bend in the curtain.

6. The apparatus of claim 5, wherein the first mounting flange is adapted to be secured between the chamber body and a clamp bar.

7. The apparatus of claim 6, wherein the first mounting flange further comprises at least one fastener hole adapted to receive at least one fastener disposed through the clamp bar, curtain and chamber body.

8. The apparatus of claim 1, wherein the second end of the curtain comprises a second mounting flange that extends substantially parallel to the at least one bend in the curtain.

9. The apparatus of claim 8, wherein the second mounting flange is adapted to be secured to the substrate support by a connection assembly.

10. The apparatus of claim 9, wherein the connection assembly comprises:
    a vent ring adapted to be coupled to the substrate support;
    an extension block, a first surface of which is adapted to be coupled to the vent ring; and
    a contour block adapted to be coupled to a second surface of the extension block.

11. The apparatus of claim 10, wherein the second mounting flange is substantially U-shaped and adapted to pass between the contour block and extension block, around an outer surface of the extension block, and between the extension block and the vent ring.

12. The apparatus of claim 10, wherein the second mounting flange further comprises at least one set of aligned fastener holes adapted to receive at least one fastener disposed through at least two of the contour block, curtain, extension block, vent ring and substrate support.

13. The apparatus of claim 10, wherein the vent ring comprises a plurality of vent paths.

14. The apparatus of claim 13, wherein at least one of the plurality of vent paths is a bevel passage positioned in a corner section of the vent ring.

15. A substrate processing chamber comprising:
    a chamber body;
    a substrate support disposed in the chamber body and having a substantially polygonal support surface; and
    a low impedance flexible curtain having a first end and a second end, the first end being electrically connected to a chamber wall and the second end being electrically connected to the substrate support, wherein the curtain further comprises:
    a first and second flexure separated by at least one bend;
    a first lift pin hole formed in the first flexure; and
    a second lift pin hole formed in the second flexure, wherein the holes in the first and second flexures are aligned equidistantly from the at least one bend.

16. The chamber of claim 15, wherein the flexures are substantially quadrilateral in shape.

17. The chamber of claim 15, wherein the flexures are adapted to allow vertical motion of the substrate support relative to the chamber wall.

18. The chamber of claim 15, wherein the curtain is adapted to be coupled to at least one edge of the substrate support.

19. The chamber of claim 18, wherein the curtain extends continuously around a full perimeter of the substrate support.

20. The chamber of claim 15, wherein the curtain further comprises:
at least one perforation formed through the flexure coupled to the second end.

21. The chamber of claim 20, wherein the substrate support further comprises at least one lift pin disposed vertically through the substrate support and lift pin holes.

22. The chamber of claim 21, wherein the at least one lift pin is urged vertically through the lift pin holes and the substrate support by contact with a bottom of the chamber.

23. The chamber of claim 15, wherein the curtain comprises a plurality of bends.

24. The chamber of claim 15, wherein the chamber is a chemical vapor deposition chamber.

25. A substrate processing chamber comprising:
a chamber body;
a vertically movable substrate support disposed in the chamber body;
a gas distribution plate coupled to a lid of the chamber; and
a low impedance flexible curtain having a first end and a second end, the first end being electrically connected to a chamber wall and the second end connected to the substrate support, wherein the curtain further comprises:
a first mounting flange adapted to secure the first end to the chamber body;
a second mounting flange adapted to secure the second end to the substrate support;
a first and second flexure separated by at least one bend;
a first lift pin hole formed in the first flexure; and
a second lift pin hole formed in the second flexure, wherein the holes in the first and second flexures are aligned equidistantly from the at least one bend.

26. The chamber of claim 25, wherein the curtain is adapted to be coupled to at least one edge of the substrate support.

27. The chamber of claim 26, wherein the curtain extends continuously around a full perimeter of the substrate support.

28. The chamber of claim 25, wherein the curtain is substantially quadrilateral in shape.

29. The chamber of claim 25, wherein the chamber is a chemical vapor deposition chamber.

30. A substrate processing chamber comprising:
a chamber body;
a substrate support disposed in the chamber body; and
a low impedance flexible curtain having a first end and a second end, the first end being electrically connected to a chamber wall and the second end connected to the substrate support, wherein the curtain further comprises:
at least one bend in the curtain material, located between the first end and the second end, the bend projecting inwardly from a perimeter of the substrate support toward a center of the substrate support;
a first flexure extending from the at least one bend toward the first end;
a second flexure extending from the at least one bend toward the second end;
a first lift pin hole formed in the first flexure; and
a second lift pin hole formed in the second flexure, wherein the holes in the first and second flexures are aligned equidistantly from the at least one bend.

31. The chamber of claim 30, wherein the curtain further comprises:
at least one perforation formed through a flexure coupled to the second end.

32. The chamber of claim 31, wherein the flexures are substantially quadrilateral in shape.

33. The chamber of claim 30, wherein the curtain comprises:
at least one perforation formed through the flexure coupled to the second end.

34. The chamber of claim 30, wherein the substrate support further comprises:
a plurality of lift pin holes disposed through the substrate support;
a plurality of substrate lift pins disposed through the plurality of lift pin holes formed through the substrate support and curtain, wherein the plurality of lift pins is urged vertically through the lift pin holes by contact with the chamber body.

35. The chamber of claim 30, wherein the curtain is adapted to be coupled to at least one edge of the substrate support.

36. The chamber of claim 30, wherein the curtain extends continuously around substantially a full perimeter of the substrate support.

37. The chamber of claim 30, wherein the curtain comprises a plurality of bends.

38. The chamber of claim 30, wherein the chamber is a chemical vapor deposition chamber.

39. The apparatus of claim 1, wherein the curtain further comprises:
at least one perforation formed through the flexure.

40. The apparatus of claim 25, wherein the curtain further comprises:
at least one perforation formed through the curtain proximate the second end.

* * * * *